(12) United States Patent
Ishibashi et al.

(10) Patent No.: US 11,817,311 B2
(45) Date of Patent: Nov. 14, 2023

(54) SUBSTRATE CLEANING METHOD AND SUBSTRATE CLEANING APPARATUS

(71) Applicant: EBARA CORPORATION, Tokyo (JP)

(72) Inventors: Tomoatsu Ishibashi, Tokyo (JP); Hiroshi Ishikawa, Tokyo (JP); Masumi Nishijima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 779 days.

(21) Appl. No.: 16/783,546

(22) Filed: Feb. 6, 2020

(65) Prior Publication Data

US 2020/0258737 A1 Aug. 13, 2020

(30) Foreign Application Priority Data

Feb. 7, 2019 (JP) .................................. 2019-020880

(51) Int. Cl.
| | |
|---|---|
| *H01L 21/02* | (2006.01) |
| *H01L 21/67* | (2006.01) |
| *B08B 1/04* | (2006.01) |

(52) U.S. Cl.
CPC .......... *H01L 21/02087* (2013.01); *B08B 1/04* (2013.01); *H01L 21/02096* (2013.01); *H01L 21/67046* (2013.01)

(58) Field of Classification Search
None
See application file for complete search history.

(56) References Cited

U.S. PATENT DOCUMENTS

| | | | |
|---|---|---|---|
| 6,059,891 A | 5/2000 | Kubota et al. | |
| 2017/0316960 A1* | 11/2017 | Ishibashi | ........... H01L 21/67253 |
| 2018/0261474 A1 | 9/2018 | Hokaku et al. | |
| 2020/0020563 A1 | 1/2020 | Nishida et al. | |

FOREIGN PATENT DOCUMENTS

| | | |
|---|---|---|
| JP | H11-040530 A | 2/1999 |
| JP | H11-244796 A | 9/1999 |
| JP | 2002-198345 A | 7/2002 |
| JP | 2017-183516 A | 10/2017 |
| JP | 2018-148179 A | 9/2018 |
| JP | 2018-164036 A | 10/2018 |
| WO | WO 2016/067562 A1 | 5/2016 |

* cited by examiner

*Primary Examiner* — Nicole Blan
(74) *Attorney, Agent, or Firm* — BakerHostetler

(57) ABSTRACT

According to one embodiment of the present disclosure, provided is a substrate cleaning method that performs an operation, in a state where a cleaning member is in contact with a rotating substrate, the cleaning member is moved between a first position on the substrate and a second position close to an edge of the substrate, n times (n is an integer of 2 or more), wherein a controller, which controls a driver that moves the cleaning member, controls the driver to perform an edge cleaning step to perform cleaning of the substrate in a state where the cleaning member is in contact with the second position on the substrate for a predetermined period of time after the cleaning member reaches the second position at least in one operation of the first to the (n-1)th operations.

7 Claims, 15 Drawing Sheets

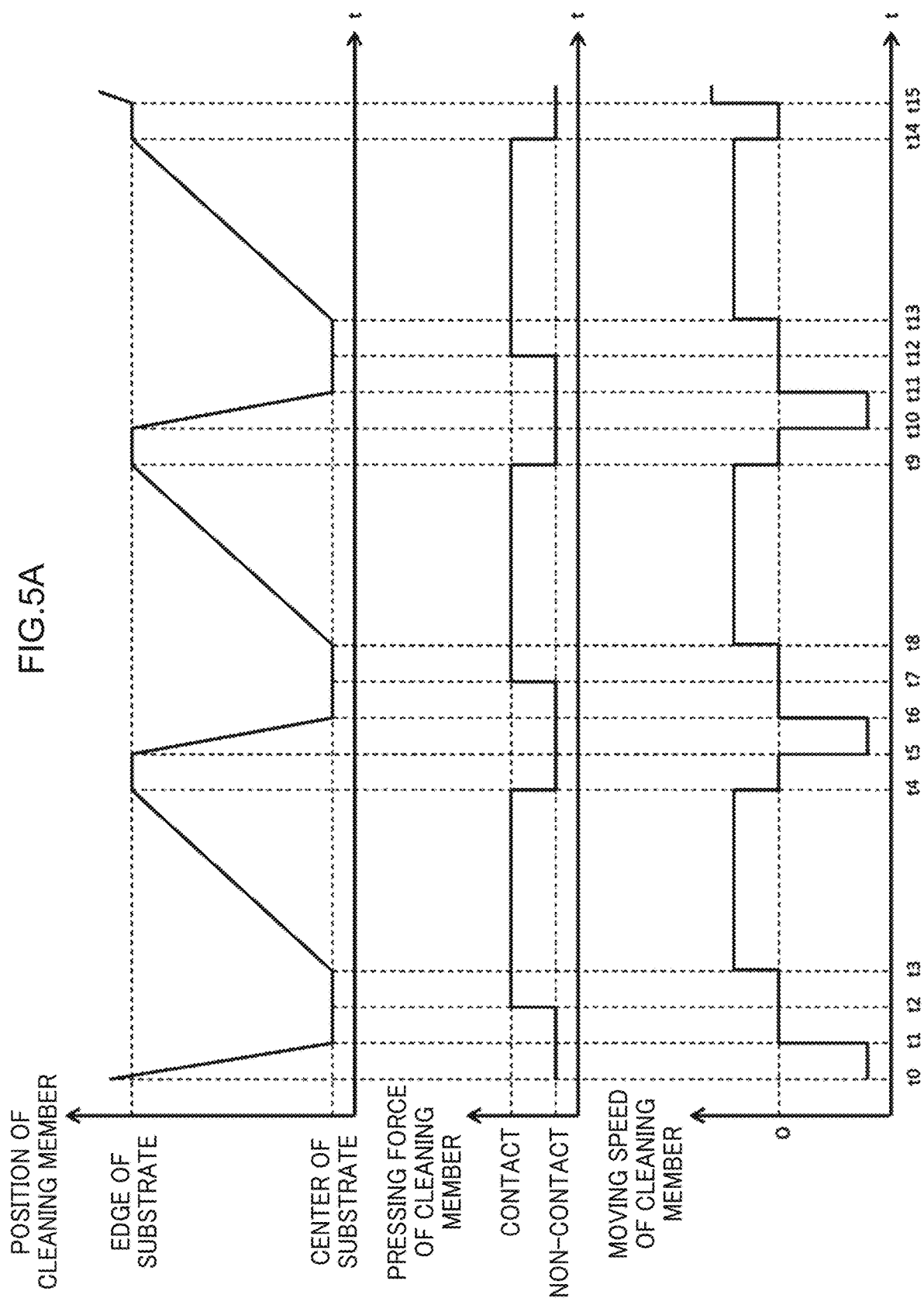

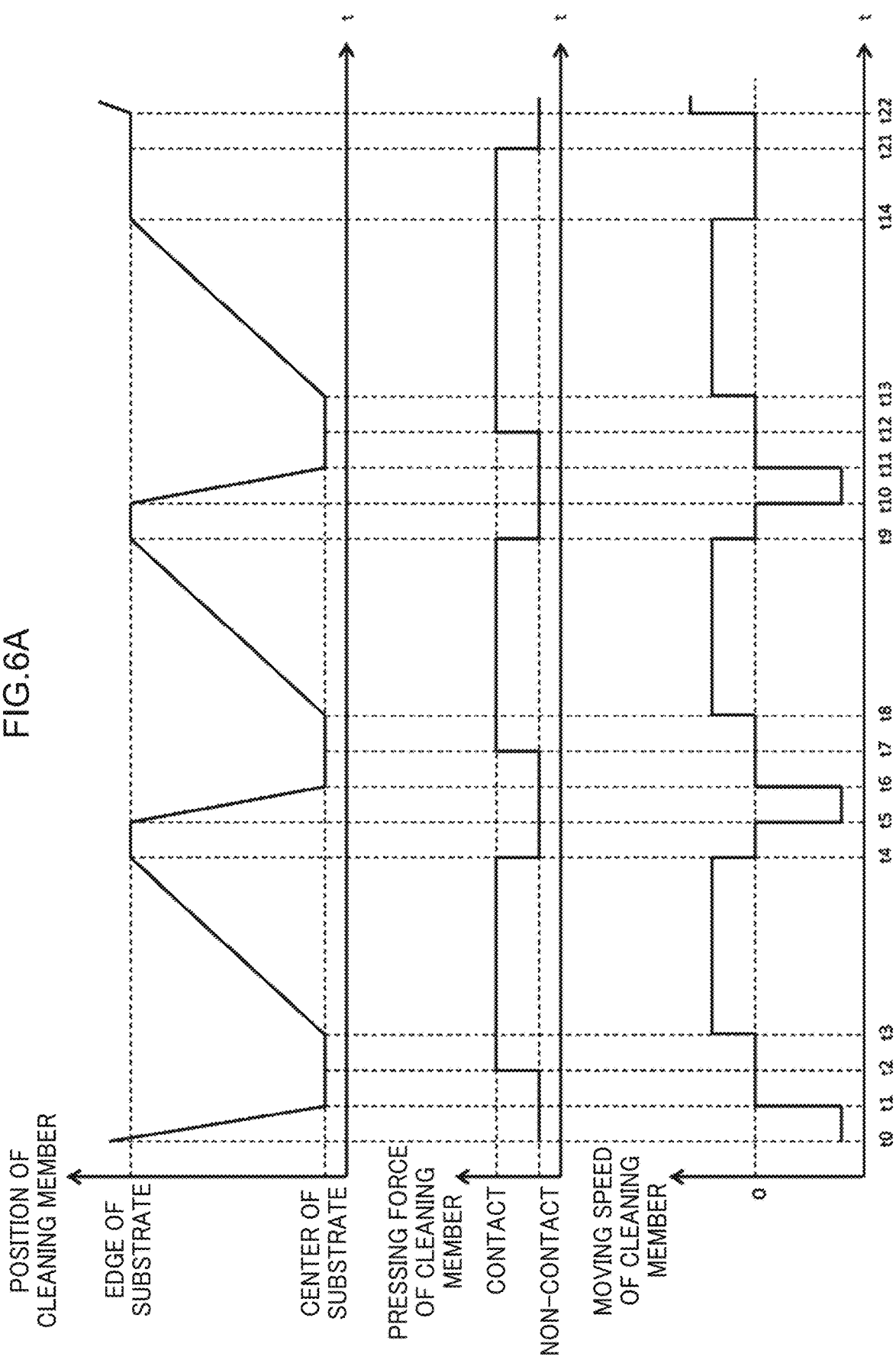

SUBSTRATE CLEANING METHOD AND SUBSTRATE CLEANING APPARATUS

CROSS REFERENCE TO RELATED APPLICATIONS

This application claims the benefit of Japanese Priority Patent Application JP 2019-020880 filed on Feb. 7, 2019, the entire contents of which are incorporated herein by reference.

FIELD

The present disclosure relates to a substrate cleaning method and a substrate cleaning apparatus for cleaning a substrate by using a cleaning member.

BACKGROUND

WO 2016/67562 A discloses a substrate cleaning apparatus that cleans a substrate such as a semiconductor wafer. The substrate cleaning apparatus cleans a surface of a substrate by causing a cleaning member to come into contact with the substrate while rotating the cleaning member. In recent year, as the miniaturization and high integration of semiconductor devices have progressed, there has been a case where removal of foreign matter generated near the edge of a semiconductor substrate during a semiconductor device manufacturing process has become a problem. However, a conventional substrate cleaning apparatus does not necessarily have sufficient cleaning capability on especially a portion close to an edge of the substrate.

As described in Patent Literature 1, it is known that a substrate cleaning apparatus that moves a scrub cleaning member in a radial direction of the substrate while causing the scrub cleaning member to be in contact with the substrate performs cleaning in a fixed position for a predetermined period of time while causing the scrub cleaning member to be still in contact with the substrate on an outer circumferential end of swinging of the scrub cleaning member. This is because a region close to an edge which should be cleaned spreads widely along the outer circumference, so that the cleaning becomes insufficient if the cleaning is ended (the scrub cleaning member is separated from the substrate) immediately after the scrub cleaning member reaches the outer circumferential end of swinging.

In recent years, the size of particles to be removed decreases year by year along with development of devices, so that it becomes obvious that a new problem of contamination of substrate occurs when performing cleaning by stopping the scrub cleaning member at the outer circumferential end of swinging.

Therefore, it is desired to provide a substrate cleaning method and a substrate cleaning apparatus that can improve cleaning capability on a portion close to the edge of the substrate.

SUMMARY

According to one embodiment of the present disclosure, provided is a substrate cleaning method that performs an operation, in a state where a cleaning member is in contact with a rotating substrate, the cleaning member is moved between a first position on the substrate and a second position close to an edge of the substrate, n times (n is an integer of 2 or more), wherein a controller, which controls a driver that moves the cleaning member, controls the driver to perform an edge cleaning step to perform cleaning of the substrate in a state where the cleaning member is in contact with the second position on the substrate for a predetermined period of time after the cleaning member reaches the second position at least in one operation of the first to the (n-1)th operations, and controls the driver so that the cleaning member is separated from the substrate at a time point when the cleaning member reaches the second position of the substrate in the nth operation.

According to another embodiment of the present disclosure, provided is a substrate cleaning method that performs an operation, in a state where a cleaning member is in contact with a rotating substrate, the cleaning member is moved between a first position on the substrate and a second position close to an edge of the substrate, n times (n is an integer of 2 or more), wherein a controller, which controls a driver that moves the cleaning member, controls the driver to perform an edge cleaning step to perform cleaning of the substrate in a state where the cleaning member is in contact with the second position on the substrate for a predetermined period of time after the cleaning member reaches the second position at least in one operation of the first to the (n-1)th operations, and controls the driver so that the cleaning member is separated from the substrate before the predetermined period of time elapses after the cleaning member reaches the second position of the substrate in the nth operation.

It is preferable that the controller controls the driver to perform the edge cleaning step after receiving a signal indicating that the cleaning member reaches the second position at least in one operation of the first to the (n-1)th operations.

It is preferable that the first position is a center on the substrate or a position close to the center, the controller controls the driver to perform an operation, in which (a) the cleaning member comes into contact with the first position on the substrate, (b) the cleaning member moves to the second position on the substrate in a state in which the substrate is cleaning the substrate, and (c) the cleaning member that reaches the second position on the substrate is separated from the substrate, n times, and the controller controls the driver to perform the edge cleaning step after the cleaning member reaches the second position in the (c) at least in one operation of the first to the (n-1)th operations.

It is preferable that a part of an outer circumference of the substrate is held by a holding member and the substrate is rotated, and the second position is a position where the cleaning member does not interfere with the holding member.

It is preferable that the cleaning member is in contact with the substrate while a rotating direction of the cleaning member is identical to a rotating direction of the substrate.

According to another embodiment of the present disclosure, provided is a substrate cleaning apparatus comprising: a substrate holding and rotating member that holds and rotates a substrate; a cleaning member; a driver that moves the cleaning member; and a controller that controls the driver, wherein the controller performs an operation, in a state where the cleaning member is in contact with the rotating substrate, the cleaning member is moved between a first position on the substrate and a second position close to an edge of the substrate, n times (n is an integer of 2 or more), performs an edge cleaning step to perform cleaning of the substrate in a state where the cleaning member is in contact with the second position on the substrate for a predetermined period of time after the cleaning member reaches the second position at least in one operation of the first to the (n-1)th operations, and controls the driver so that the cleaning member is separated from the substrate at a time point when the cleaning member reaches the second position of the substrate in the nth operation.

According to another embodiment of the present disclosure, provided is a substrate cleaning apparatus comprising: a substrate holding and rotating member that holds and rotates a substrate; a cleaning member; a driver that moves the cleaning member; and a controller that controls the driver, wherein the controller performs an operation, in which in a state where the cleaning member is in contact with the rotating substrate, the cleaning member is moved between a first position on the substrate and a second position close to an edge of the substrate, n times (n is an integer of 2 or more), performs an edge cleaning step to perform cleaning of the substrate in a state where the cleaning member is in contact with the second position on the substrate for a predetermined period of time after the cleaning member reaches the second position at least in one operation of the first to the (n-1)th operations, and controls the driver so that the cleaning member is separated from the substrate before the predetermined period of time elapses after the cleaning member reaches the second position of the substrate in the nth operation.

According to another embodiment of the present disclosure, provided is a computer-readable storage medium that non-transitory stores a program that controls a substrate cleaning apparatus including a substrate holding and rotating member that holds and rotates a substrate, a cleaning member, and a driver that moves the cleaning member, wherein when the program is executed, the driver performs an operation, in a state where the cleaning member is in contact with the rotating substrate, the cleaning member is moved between a first position on the substrate and a second position close to an edge of the substrate, n times (n is an integer of 2 or more), performs an edge cleaning step to perform cleaning of the substrate in a state where the cleaning member is in contact with the second position on the substrate for a predetermined period of time after the cleaning member reaches the second position at least in one operation of the first to the (n-1)th operations, and controls the driver so that the cleaning member is separated from the substrate at a time point when the cleaning member reaches the second position of the substrate in the nth operation.

According to another embodiment of the present disclosure, provided is a computer-readable storage medium that non-transitory stores a program that controls a substrate cleaning apparatus including a substrate holding and rotating member that holds and rotates a substrate, a cleaning member, and a driver that moves the cleaning member, wherein when the program is executed, the controller performs an operation, in a state where the cleaning member is in contact with the rotating substrate, the cleaning member is moved between a first position on the substrate and a second position close to an edge of the substrate, n times (n is an integer of 2 or more), performs an edge cleaning step to perform cleaning of the substrate in a state where the cleaning member is in contact with the second position on the substrate for a predetermined period of time after the cleaning member reaches the second position at least in one operation of the first to the (n-1)th operations, and controls the driver so that the cleaning member is separated from the substrate before the predetermined period of time elapses after the cleaning member reaches the second position of the substrate in the nth operation.

BRIEF DESCRIPTION OF DRAWINGS

FIG. 5A is a time chart showing a motion of the cleaning member 61 when performing substrate cleaning according to a comparative example that does not perform edge stop processing;

FIG. 6A is a time chart showing a motion of the cleaning member 61 when performing the substrate cleaning according to the comparative example that performs the edge stop processing in a final cleaning step;

DETAILED DESCRIPTION OF NON-LIMITING EXAMPLE EMBODIMENTS

Hereinafter, an embodiment according to the present disclosure will be specifically described with reference to the drawings.

Figure 1:
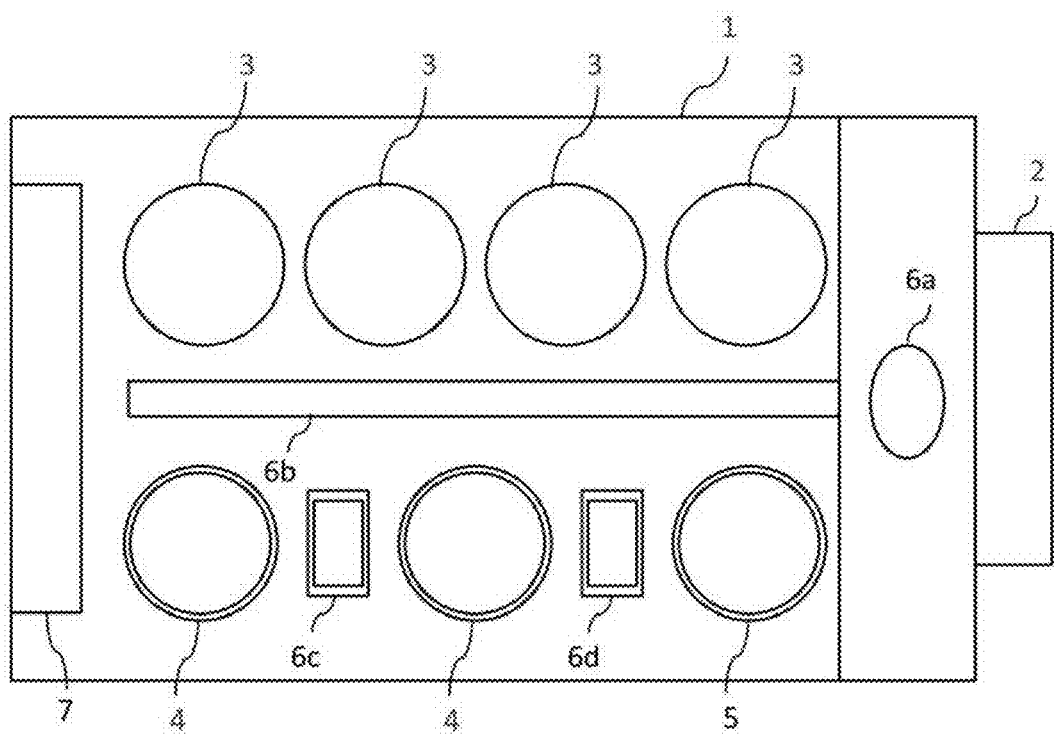
FIG. 1 is a schematic top view of a substrate processing apparatus according to an embodiment.

FIG. 1 is a schematic top view of a substrate processing apparatus according to the embodiment. The substrate processing apparatus processes various substrates in manufacturing processes of a semiconductor wafer with a diameter of 300 mm or 450 mm, a flat panel, an image sensor of CMOS (Complementary Metal Oxide Semiconductor) or CCD (Charge Coupled Device), and a MRAM (Magnetoresistive Random Access Memory). The shape of the substrate is not limited to a circle, but may be a rectangle (square) or a polygon.

The substrate processing apparatus includes a substantially rectangular housing 1, a load port 2 mounted with a substrate cassette that stores a large number of substrates, one or a plurality of (four in an aspect shown in FIG. 1) substrate polishing apparatuses 3, one or a plurality of (two in the aspect shown in FIG. 1) substrate cleaning apparatuses 4, a substrate drying apparatus 5, transport mechanisms 6a to 6d, and a controller 7.

The load port 2 is arranged adjacent to the housing 1. The load port 2 can be mounted with an open cassette, a SMIF (Standard Mechanical Interface) pod, or a FOUP (Front Opening Unified Pod). The SMIF pod and the FOUP are sealed containers that can store a substrate cassette inside thereof and can maintain an environment independent from outside space by covering with a partition wall. Examples of the substrate include a semiconductor wafer and the like.

The substrate polishing apparatuses 3 that polish the substrate, the substrate cleaning apparatuses 4 that clean the substrate that has been polished, and the substrate drying apparatus 5 that dries the substrate that has been cleaned are stored in the housing 1. The substrate polishing apparatuses 3 are arranged along a longitudinal direction of the substrate processing apparatus, and the substrate cleaning apparatuses 4 and the substrate drying apparatus 5 are also arranged along the longitudinal direction of the substrate processing apparatus.

Each of the substrate cleaning apparatuses 4 and the substrate drying apparatus 5 may be a substantially rectangular case body not shown in the drawings and may be configured so that a substrate to be processed is moved in/out to/from an opening/closing part that is provided to a case body part and can be opened and closed by a shutter mechanism. Alternatively, as a modified embodiment, the substrate cleaning apparatuses 4 and the substrate drying apparatus 5 may be integrated, and substrate cleaning processing and substrate drying processing may be continuously performed in one unit.

The transport mechanism 6a is arranged in a region surrounded by the load port 2, the substrate polishing apparatus 3 located on the side of the load port 2, and the substrate drying apparatus 5. The transport mechanism 6b is arranged in parallel with the substrate polishing apparatuses 3 and in parallel with the substrate cleaning apparatuses 4 and the substrate drying apparatus 5.

The transport mechanism 6a receives a substrate before being polished from the load port 2 and transfers the substrate to the transport mechanism 6b. Further, the transport mechanism 6a receives a substrate after being dried, which is taken out from the substrate drying apparatus 5, from the transport mechanism 6b.

The transport mechanism 6c that transfers the substrate between the substrate cleaning apparatuses 4 is arranged between the two substrate cleaning apparatuses 4, and the transport mechanism 6c that transfers the substrate between the substrate cleaning apparatus 4 and the substrate drying apparatus 5 is arranged between the substrate cleaning apparatus 4 and the substrate drying apparatus 5.

Further, the controller 7 that controls a motion of each equipment of the substrate processing apparatus is arranged inside the housing 1. In the present embodiment, an aspect where the controller 7 is arranged inside the housing 1 will be described. However, the controller 7 may be arranged outside the housing 1. As in the embodiment described later, for example, it is possible to configure so that the controller 7 controls an operation of a substrate holding and rotating mechanism 41 that holds and rotates a substrate, start and end timing of discharge of a nozzle that ejects ultrasonic cleaning liquid to the substrate, or vertical movement and rotating movement in vertical and horizontal planes of the nozzle. The controller may have a memory that stores a predetermined grogram, a central processing unit (CPU) that executes the program of the memory, and a control module that is realized when the CPU executes the program. The control module or the controller is configured to be able to communicate with a higher-level controller (not shown in the drawings) that integrally controls the substrate processing apparatus and other related apparatuses, and can transmit and receive data to and from a database included in the higher-level controller. Here, a storage medium constituting the memory stores various setting data and various programs such as a processing program. As the storage medium, it is possible to use a known medium such as a memory including a computer-readable ROM or RAM and a disk-shaped storage medium such as a hard disk, a CD-ROM, a DVD-ROM, and a flexible disk.

Figure 2:
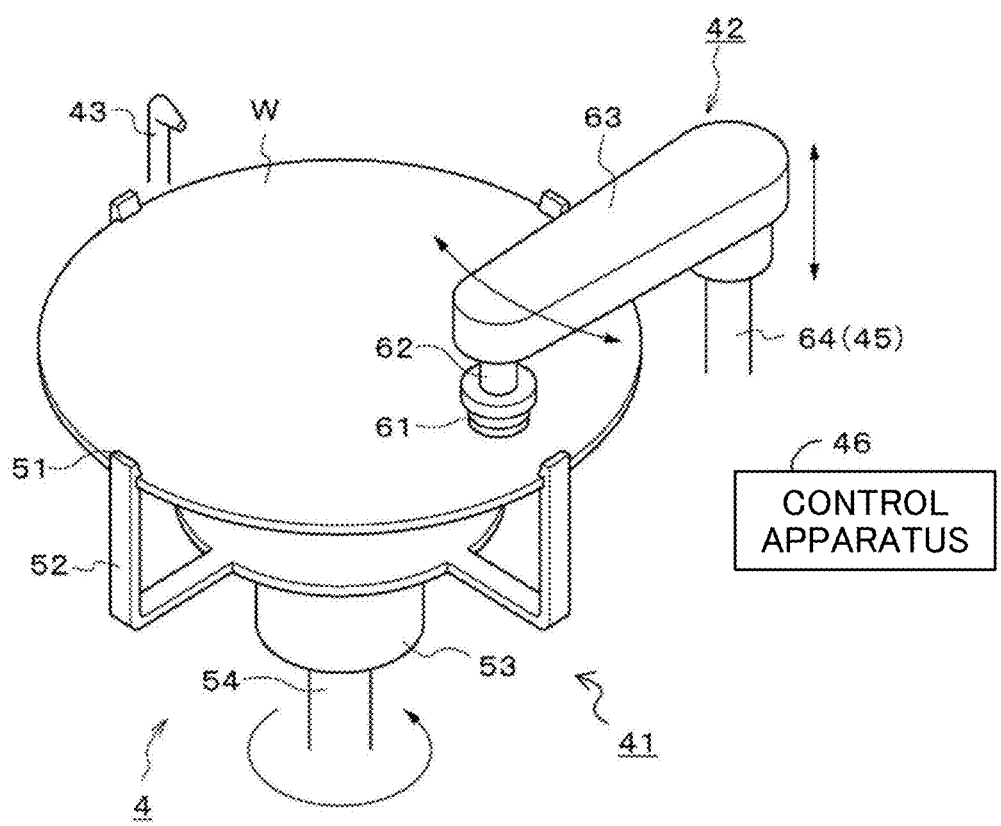
FIG. 2 is a perspective view showing a schematic configuration of a substrate cleaning apparatus 4.

FIG. 2 is a perspective view showing a schematic configuration of the substrate cleaning apparatus 4. The substrate cleaning apparatus 4 includes the substrate holding and rotating mechanism 41, a cleaning mechanism 42, and one or a plurality of nozzles 43.

The substrate holding and rotating mechanism 41 horizontally holds and rotates a substrate W such as a semiconductor wafer. More specifically, the substrate holding and rotating mechanism 41 includes a plurality of (four in FIG. 2) arms 52 each of which is attached with a chuck 51 for holding an outer circumferential end portion (edge portion) of the substrate W, a base table 53 integrally attached with the arms 52, a rotating shaft 54 that rotates the base table 53, and the like. The rotating shaft 54 extends vertically with respect to (that is, extends in perpendicular to) a surface of the substrate W and rotates the substrate W in a horizontal plane by rotation of the rotating shaft 54.

The cleaning mechanism 42 includes a cleaning member 61, a rotating shaft 62, a swinging arm 63, a swinging shaft 64, and the like.

The cleaning member 61 is, for example, a pencil-type cleaning tool made of PVA. The lower surface of the cleaning member 61 is a cleaning surface and the upper surface of the cleaning member 61 is fixed to the lower surface of the rotating shaft 62.

The rotating shaft 62 extends vertically with respect to (that is, extends in perpendicular to) a surface of the substrate W and rotates the cleaning member 61 in a horizontal plane by rotation of the rotating shaft 62.

The swinging arm 63 extends in a horizontal direction. One end of the swinging arm 63 is connected to an upper end of the rotating shaft 62, and the other end is connected to the swinging shaft 64. The swinging shaft 64 is attached with a motor not shown in the drawings.

The swinging shaft 64 extends vertically with respect to (that is, extends in perpendicular to) a surface of the substrate W and can move upward and downward. When the swinging shaft 64 moves downward, the lower surface of the cleaning member 61 comes into contact with the surface of the substrate W, and when the swinging shaft 64 moves upward, the lower surface of the cleaning member 61 is separated from the surface of the substrate W. The swinging arm 63 is swung in the horizontal plane by rotation of the swinging shaft 64.

The cleaning mechanism 42 may have a means that swings the cleaning member 61 and a means that switches contact/non-contact of the cleaning member 61 with the substrate W (hereinafter these means that move the cleaning member 61 are collectively referred to as a "driver 45", and a specific configuration of the cleaning mechanism 42 is not limited to the swinging shaft 64 shown in FIG. 2. For example, a control apparatus 46 may control these means based on a predetermined recipe. In the present embodiment, when the control apparatus 46 receives a signal indicating a rotation angle of the swinging arm 63 from a motor driver that rotates the motor attached to the swinging shaft 64, the control apparatus 46 determines a position of the cleaning member 61. Further, the control apparatus 46 controls a rotation angle of the motor.

The substrate cleaning apparatus 4 having such a configuration operates as described below. Cleaning liquid (pure water or chemical liquid) is supplied from the nozzle 43 onto the substrate W that is held by the chucks 51 of the substrate holding and rotating mechanism 41 and rotated by the rotating shaft 54. At the same time, the rotating shaft 62 rotates the cleaning member 61 and the swinging shaft 64 swings the cleaning member 61 in a state in which the swinging shaft 64 causes the lower surface of the cleaning member 61 to come into contact with the surface of the substrate W. Thereby, the substrate W is cleaned.

The details of the movement of the cleaning member 61 is as follows:

(1) The swinging shaft 64 rotates in a state in which the cleaning member 61 is separated from the substrate W, and the cleaning member 61 moves to above the center of the substrate.

(2) The swinging shaft 64 moves downward, and the lower surface of the cleaning member 61 comes into contact with the center of the substrate W.

(3) The swinging shaft 64 rotates and the cleaning member 61 moves from the center of the substrate W toward the edge of the substrate W in a state in which the lower surface of the cleaning member 61 is in contact with the substrate W.

(4) When the cleaning member 61 reaches a predetermined position close to the edge, the swinging shaft 64 moves upward and the lower surface of the cleaning member 61 is separated from the substrate W.

The cleaning of (1) to (4) described above is repeated a plurality of times.

Here, in (4) described above, although the cleaning member 61 can be moved close to the edge of the substrate W, it is difficult to move (overhang) the cleaning member 61 to the outside of the substrate W. This is because the cleaning member 61 collides with the chuck 51 that holds the outer circumferential end portion of the substrate W.

It can also be considered that in the final cleaning step (4) described above, the movement of the cleaning member 61 (that is, the rotation of the swinging shaft 64) is stopped when the cleaning member 61 reaches a predetermined position close to the edge, and the cleaning member 61 is separated from the substrate W after a state in which the cleaning member 61 is in contact with a portion close to the edge of the substrate W is maintained for a certain period of time. This is to secure a sufficient cleaning time per unit area of a region close to the edge of the substrate W spreading in a circumferential direction.

Figure 3:
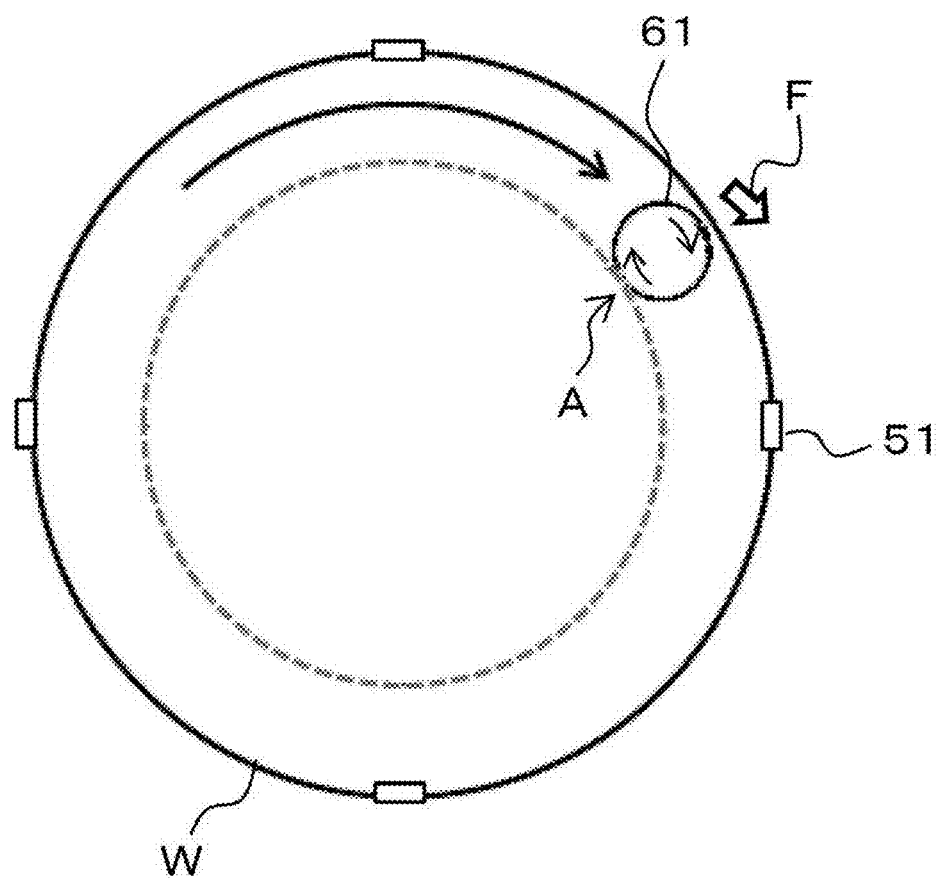
FIG. 3 is a diagram schematically showing a state in which a cleaning member 61 is in contact with a portion close to an edge of a substrate W.

FIG. 3 is a diagram schematically showing a state in which the cleaning member 61 is in contact with a portion close to the edge of the substrate W. The portion which the cleaning member 61 is in contact with is cleaned by maintaining the above state for a certain period of time. However, a portion indicated by a dashed line in FIG. 3 may be contaminated against intention by a reason described below.

As shown in FIG. 3, the substrate W and the cleaning member 61 rotate in the same direction (in a clockwise direction in FIG. 3). This is to make a rotation direction of the substrate W match with a rotation direction of the cleaning member 61 on the outermost circumference of the substrate W and discharge contaminated cleaning liquid to the outside of the substrate W (arrow F). However, in this case, the substrate W and the cleaning member 61 rotate in the opposite directions inside the substrate W (at a position close to a point A), so that the contaminated cleaning liquid gathers to the position. When the swinging of the cleaning member 61 is stopped and the cleaning member 61 is continuously in contact with the substrate W, as a result, the portion indicated by the dashed line is reversely contaminated. Such a reverse contamination problem becomes more remarkable as devices formed on the substrate W are miniaturized. Although a phenomenon where fine particles remain in the portion indicated by the dashed line cannot be specifically explained, it can be considered that particles attached to the cleaning member 61 flow with the cleaning liquid, gather to the portion indicated by the dashed line, and attach to the substrate again.

Therefore, in the present embodiment, as described below, in the above (4) other than the final cleaning step, the movement of the cleaning member 61 (that is, the rotation of the swinging shaft 64) is stopped when the cleaning member 61 reaches a position close to the edge, and the cleaning member 61 is separated from the substrate W after a state in which the cleaning member 61 is in contact with the position close to the edge of the substrate W is maintained for a certain period of time. In the above (4) in the final cleaning step, the cleaning member 61 is separated from the substrate W when the cleaning member 61 reaches a position close to the edge. Thereby, even when the contamination of the portion indicated by the dashed line in FIG. 3 occurs in the cleaning steps before the final cleaning step, the contamination is cleaned up by the final cleaning step.

Figure 4:
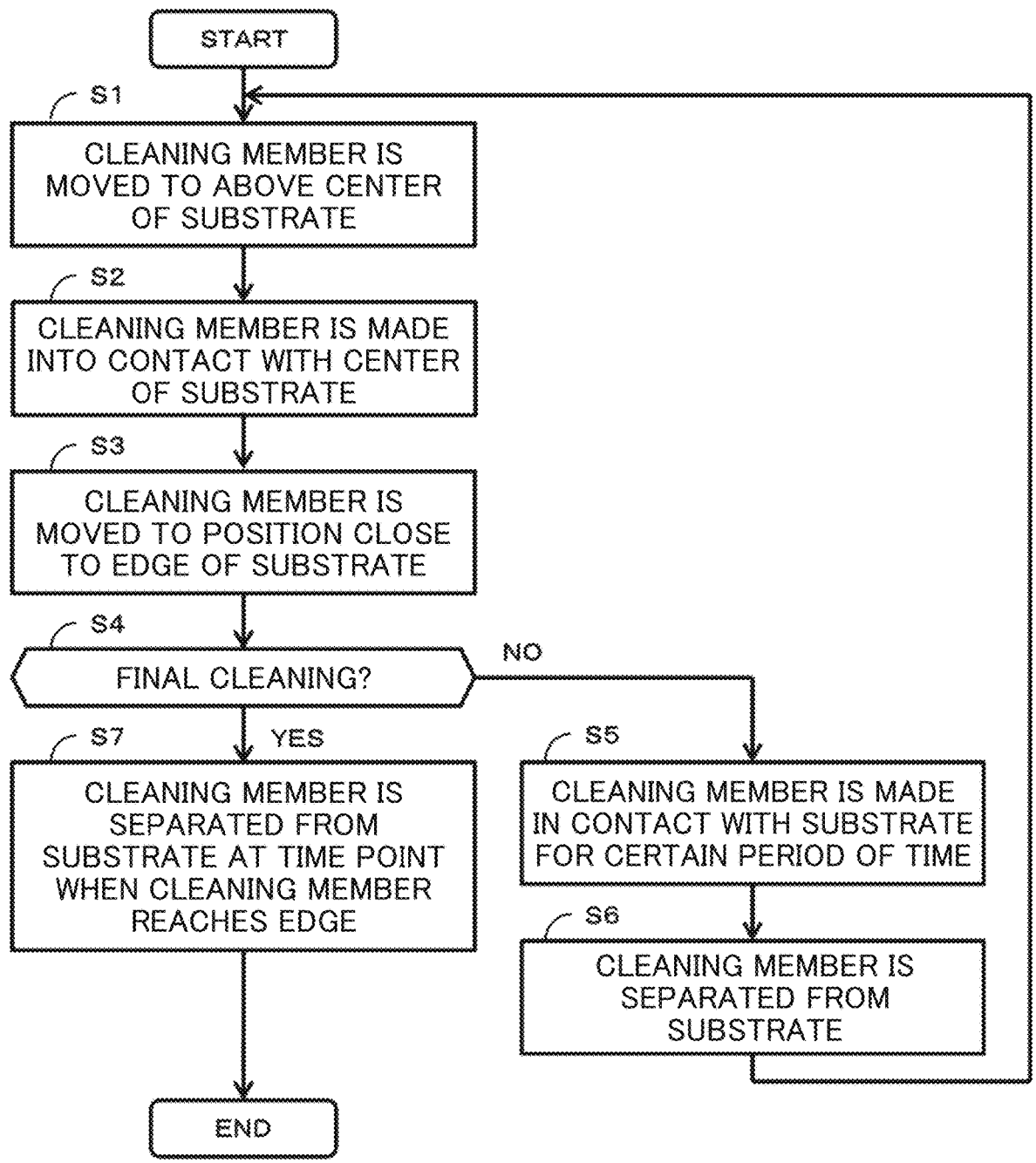
FIG. 4 is a flowchart showing a procedure of substrate cleaning according to the present embodiment.

FIG. 4 is a flowchart showing a procedure of substrate cleaning according to the present embodiment. In the description below, the cleaning step is performed three times. The substrate W is held and rotated by the substrate holding and rotating mechanism 41. Further, the cleaning liquid is supplied from the nozzle 43 onto the substrate W.

First, the swinging shaft 64 rotates in a state in which the swinging shaft 64 is raised, so that the cleaning member 61 is moved to above the center of the substrate W (step S1). Specifically, the control apparatus 46 monitors the signal indicating the rotation angle of the swinging arm 63 from the motor driver attached to the swinging shaft 64 and performs control so as to stop the rotation of the swinging shaft 64 by a motor at a time point when the signal indicates that the cleaning member 61 reaches the center of the substrate W.

Next, the swinging shaft 64 moves downward, and the lower surface of the cleaning member 61 comes into contact with the center of the substrate W (step S2). Then, the swinging shaft 64 rotates in a state in which the cleaning member 61 is in contact with the substrate W, and the cleaning member 61 is moved to a predetermined position close to the edge of the substrate W (step S3). Specifically, the control apparatus 46 monitors the signal indicating the rotation angle of the swinging arm 63 from the motor driver attached to the swinging shaft 64 and performs control so as to stop the rotation of the swinging shaft 64 by a motor at a time point when the signal indicates that the cleaning member 61 reaches the predetermined position. The position is a position where the cleaning member 61 does not collide (interfere) with the rotating chuck 51.

In a first cleaning step (NO in step S4), the rotation of the swinging shaft 64 stops at a time point when the cleaning member 61 reaches a predetermined position (see FIG. 3), but the rotating shaft 54 rotates continuously. Thereby, the cleaning member 61 stops on the substrate W but rotates continuously. The lower surface of the rotating cleaning member 61 is continuously made in contact with the substrate W for a certain period of time (step S5). In the description below, the processing shown in step S5 may be referred to as edge stop processing. The control apparatus 46 counts how many times the cleaning step is performed. The step shown in step S5 may be referred to as an edge cleaning step. That is, in step S5, the control apparatus 46 controls the driver 45 to perform the edge cleaning step in which in a state where the cleaning member 61 stops at a predetermined position, the cleaning member 61 cleans the substrate W while the cleaning member 61 is in contact with the substrate W.

After a certain period of time elapses, the swinging shaft 64 moves upward, and the cleaning member 61 is separated from the substrate W (step S6). Then, the swinging shaft 64 rotates, so that the cleaning member 61 is moved to above the center of the substrate W (step S1). Subsequently, steps S2 and S3 are performed. Also in the second cleaning step (NO in step S4), the cleaning step proceeds to steps S5 and S6 and returns to step S1.

In the third cleaning step (YES in step S4), not only the rotation of the swinging shaft 64 stops at a time point when the cleaning member 61 reaches a predetermined position, but also the swinging shaft 64 moves upward and the cleaning member 61 is separated from the substrate W (step S7). Then, the cleaning processing is completed. An operator may perform control of part or all of the cleaning processing described above (specifically, the vertical movement and the rotation of the swinging shaft 64 and the like), or a controller that operates with a predetermined program may perform the control.

Subsequently, an operation of the cleaning member 61 will be focused and described.

FIG. 5A is a time chart showing a motion of the cleaning member 61 when performing substrate cleaning according to a comparative example that does not perform the edge stop processing. An upper time chart shows a position of the cleaning member 61 based on the substrate W. The position is controlled by a rotation angle of the swinging shaft 64. A middle time chart shows a pressing force of the cleaning member 61 against the substrate W. To simplify the description, in FIG. 5A, the pressing force is represented by a binary value indicating whether or not the cleaning member 61 is in contact with the substrate W. The pressing force (contact/non-contact) is controlled by the vertical movement of the swinging shaft 64. A lower time chart shows a moving speed of the cleaning member 61 in an in-plane direction of the substrate W, and a direction from the center to the edge of the substrate W is defined as positive. The moving speed is controlled by a rotation speed of the swinging shaft 64.

When the substrate W is held by the chucks 51 of the substrate holding and rotating mechanism 41, the cleaning member 61 moves toward the center of the substrate W without coming into contact with the substrate W, and the cleaning member 61 stops above the center of the substrate W (time t0 to t1). At time t2, the cleaning member 61 moves downward and comes into contact with the substrate W. Thereafter, at time t3, the cleaning member 61 begins to move toward the edge of the substrate W. In time t0 to t1 in the lower time chart, although the moving speed of the cleaning member 61 is constant, the moving speed may be fast around the center of the substrate W and may gradually slow down as the cleaning member 61 approaches the edge. The same goes for the moving speed of the cleaning member 61 in the other time.

When the cleaning member 61 reaches a predetermined position close to the edge of the substrate W at time t4, the cleaning member 61 stops moving at that time point and moves upward to be in non-contact with the substrate W. Thereafter, at time t5, the cleaning member 61 begins to move toward the center of the substrate W without coming into contact with the substrate W, and the cleaning member 61 stops above the center of the substrate W (time t5 to t6). Thereafter, the same cleaning step is performed three times (time t6 to t14).

At a time point when the cleaning member 61 reaches close to the edge of the substrate at the time t14, the third cleaning step which is the final step is completed, and the cleaning member 61 stops moving and moves upward to be in non-contact with the substrate W. Thereafter, at time t15, the cleaning member 61 moves toward the outside of the substrate W.

Figure 5B:
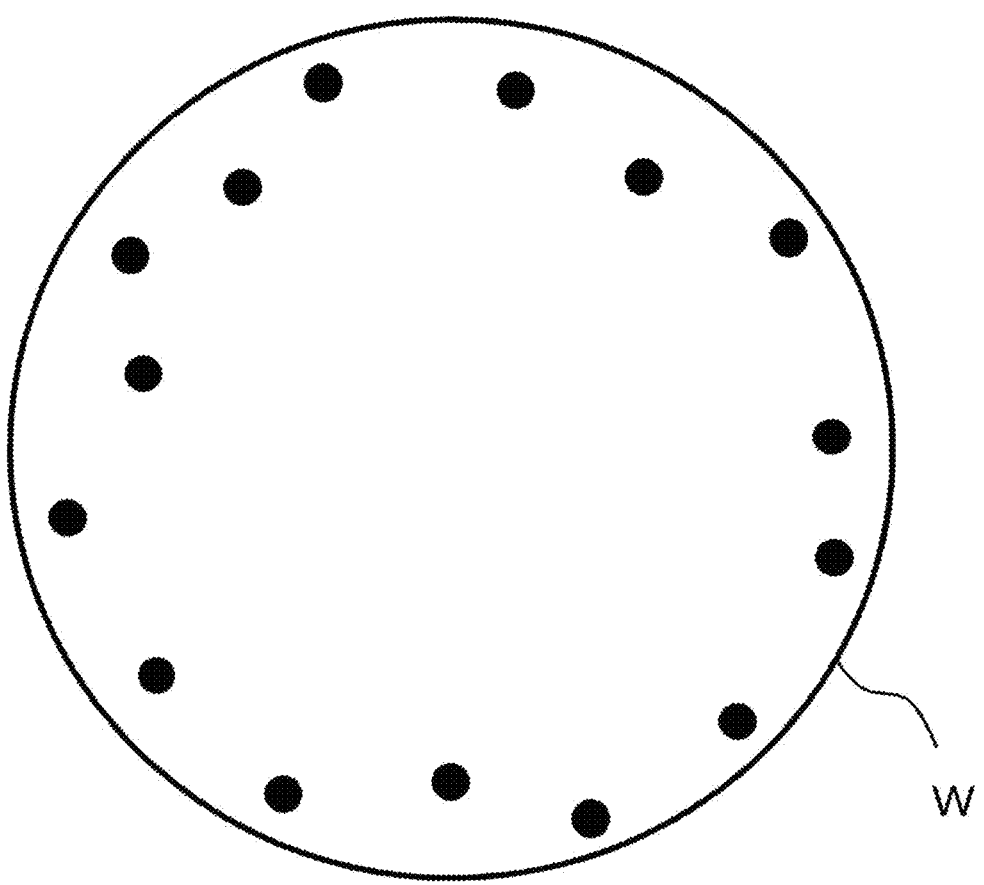
FIG. 5B is a diagram schematically showing a result of the substrate cleaning shown in FIG. 5A.

FIG. 5B is a diagram schematically showing a result of the substrate cleaning shown in FIG. 5A. Black circles indicate particles remaining on the substrate W (particles to be removed from the substrate W). As described above, the overhang cannot be performed, so that the cleaning of the outer circumferential portion of the substrate W is insufficient.

FIG. 6A is a time chart showing a motion of the cleaning member 61 when performing the substrate cleaning according to the comparative example that performs the edge stop processing in the final cleaning step. FIG. 6A corresponds to FIG. 5A. The processing from time t0 to time t14 is the same as that of FIG. 5A.

When the cleaning member 61 reaches a predetermined position close to the edge of the substrate W at time t14, the edge stop processing is performed. Specifically, at a time point when the cleaning member 61 reaches a predetermined position close to the edge of the substrate W, the swinging shaft 64 stops rotating. However, the swinging shaft 64 does not move upward and the cleaning member 61 is still in contact with the substrate W for a certain period of time (time t14 to t21). The certain period of time is a period of time required to sufficiently clean the substrate W. For example, the certain period of time is 10 seconds.

At time t21 after the certain period of time elapses, the third and final cleaning step including the edge stop processing is completed, and the cleaning member 61 moves upward to be in non-contact with the substrate W. Thereafter, at time t22, the cleaning member 61 moves toward the outside of the substrate W.

Figure 6B:
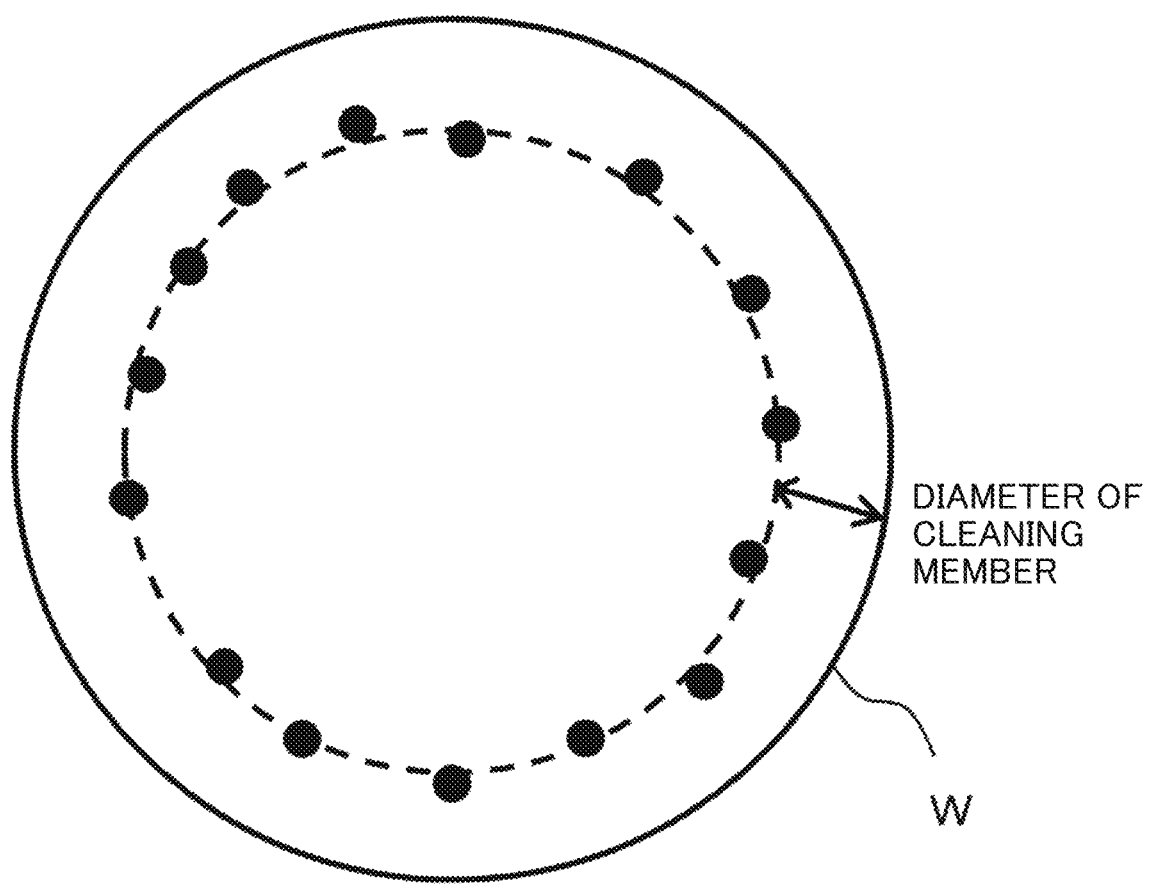
FIG. 6B is a diagram schematically showing a result of the substrate cleaning shown in FIG. 6A.

FIG. 6B is a diagram schematically showing a result of the substrate cleaning shown in FIG. 6A. As compared with FIG. 5B, the outer circumferential portion of the substrate W is cleaned by performing the edge stop processing. However, as described with reference to FIG. 3, an inside portion, which is located a distance corresponding to the diameter of the cleaning member 61 inside from the outermost circumference of the substrate W, is reversely contaminated.

Figure 7A:
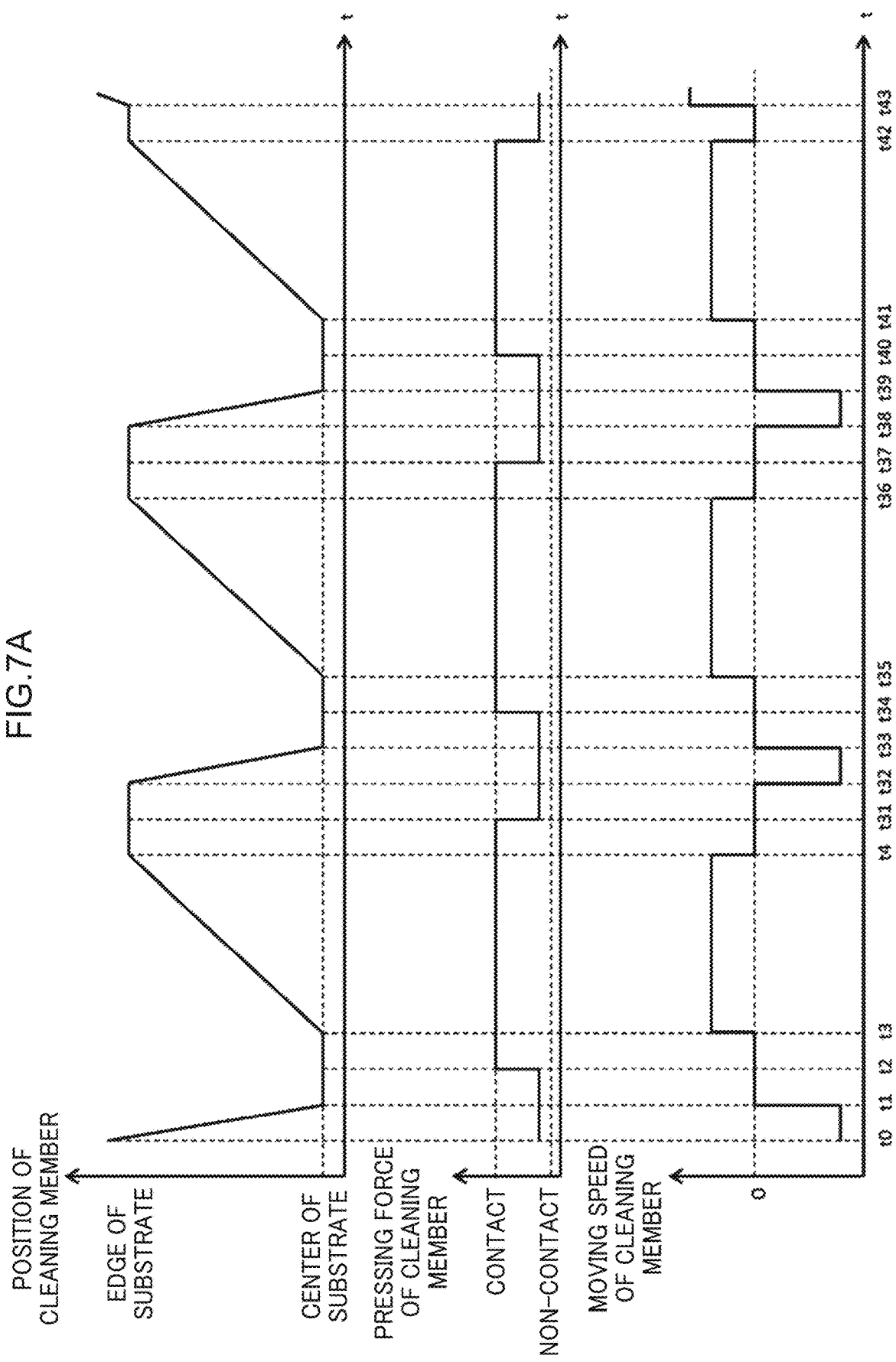
FIG. 7A is a time chart showing a motion of the cleaning member 61 when performing the substrate cleaning according to the present embodiment that performs the edge stop processing in a cleaning step other than the final cleaning step.

FIG. 7A is a time chart showing a motion of the cleaning member 61 when performing the substrate cleaning according to the present embodiment that performs the edge stop processing in a cleaning step other than the final cleaning step. FIG. 7A corresponds to FIG. 6A. The processing from time t0 to time t4 is the same as that of FIG. 6A.

When the cleaning member 61 reaches a predetermined position close to the edge of the substrate W at time t4, the edge stop processing is performed. Specifically, at a time point when the cleaning member 61 reaches a predetermined position close to the edge of the substrate W, the swinging shaft 64 stops rotating (thereby, the swinging of the cleaning member 61 is stopped). However, the swinging shaft 64 does not move upward and the cleaning member 61 is still in contact with the substrate W for a certain period of time (time t4 to t31). The certain period of time is a period of time required to sufficiently clean the substrate W. For example, the certain period of time is 5 seconds.

In the comparative example shown in FIG. 6A, the edge stop processing is performed only in the final cleaning step. On the other hand, in the present embodiment, the edge stop processing is performed in the first and the second cleaning steps. Therefore, each period of time in which the cleaning member 61 is in contact with the substrate W can be shortened.

At time t31 after the certain period of time elapses, the cleaning member 61 moves upward to be in non-contact with the substrate W. Thereafter, at time t32, the cleaning member 61 moves toward the center of the substrate W. Thereafter, the same cleaning step including the edge stop processing is performed once again (time t33 to t38).

The edge stop processing is not performed in the third and final cleaning step. Specifically, when the cleaning member 61 reaches a predetermined position close to the edge of the substrate W at time t42, the cleaning member 61 stops moving at that time point and moves upward to be in non-contact with the substrate W. In other words, at the time t42, the swinging shaft 64 stops rotating and moves upward. Thereafter, at time t43, the cleaning member 61 moves toward the outside of the substrate W.

Figure 7B:
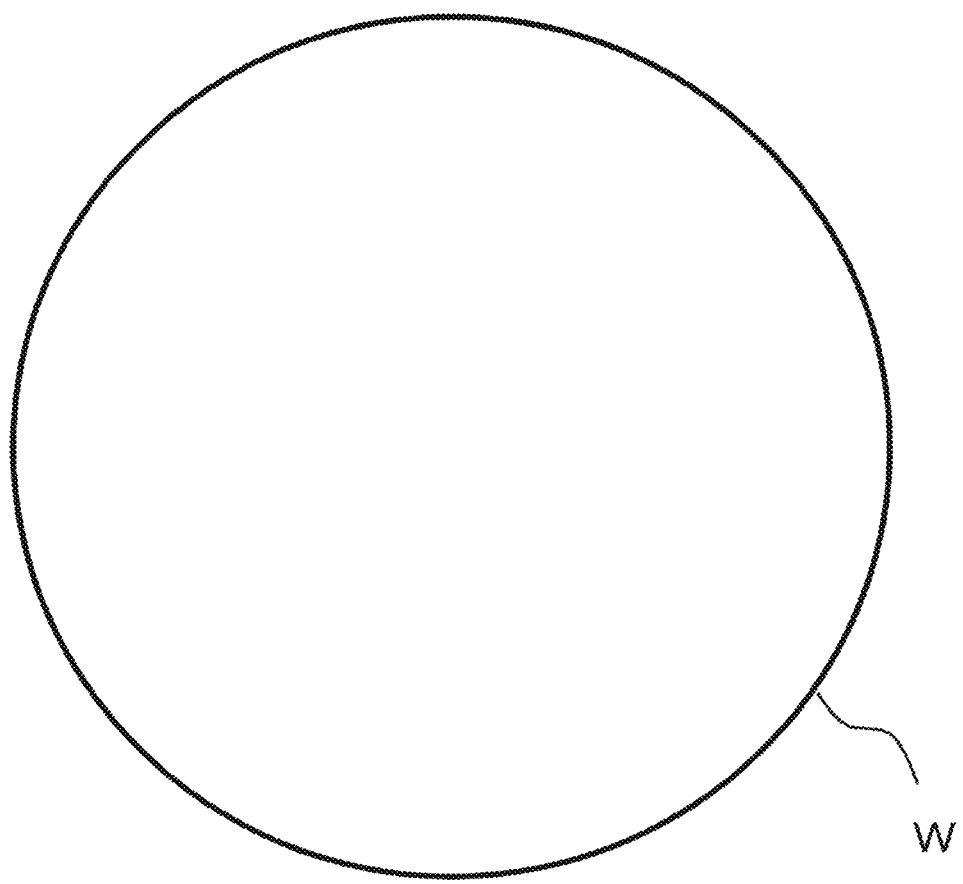
FIG. 7B is a diagram schematically showing a result of the substrate cleaning shown in FIG. 7A.

FIG. 7B is a diagram schematically showing a result of the substrate cleaning shown in FIG. 7A. The outer circumferential portion of the substrate W is cleaned by the first and the second edge stop processing. A reverse contamination as shown in FIG. 6B may be generated by the edge stop processing. However, in the substrate cleaning according to the present embodiment, the edge stop processing is not performed in the final cleaning step. Therefore, different from FIG. 6B, the reverse contamination of an inside portion, which is located a distance corresponding to the diameter of the cleaning member 61 inside from the outermost circumference of the substrate W, is eliminated.

The control apparatus 46 receives a signal indicating that the cleaning member 61 reaches a predetermined position close to the edge of the substrate W, and thereafter performs the edge stop processing. That is, the control apparatus 46 stops the swinging of the swinging arm 63 and causes the cleaning member 61 to be continuously in contact with the substrate W for a predetermined period of time. In the example described above, the signal indicating that the cleaning member 61 reaches a predetermined position close to the edge of the substrate W is a signal related to an angle of the swinging arm 63, which is transmitted from the motor driver that rotates the swinging shaft 64 to the control apparatus 64. In addition, a sensor that detects that the cleaning member 61 reaches a predetermined position close to the edge of the substrate W may be provided in the substrate cleaning apparatus 4, and a signal from the sensor may be received by the control apparatus 46. More specifically, a laser is arranged above a predetermined position close to the edge of the substrate W, a razor light is irradiated to the substrate W, a reflected light from the substrate W is sensed by the sensor, and it may be detected that the substrate W is above a predetermined position close to the edge according to time until the reflected light is sensed.

When the edge stop processing is not performed, the control apparatus 46 causes the cleaning member 61 to be separated from the substrate after receiving the signal indicating that the cleaning member 61 reaches a predetermined position close to the edge of the substrate W.

It can also be considered to set a swinging speed of the cleaning member 61 and a moving time from when the cleaning member 61 moves down on the substrate W at the center of the substrate W and begins cleaning to when the cleaning member 61 moves to a position close to the edge of the substrate W. In this case, the control apparatus 46 may perform the edge stop processing after the moving time elapses without receiving the signal indicating that the cleaning member 61 reaches a predetermined position close to the edge of the substrate W.

Regarding a cleaning method according to the present embodiment described above, an example in which the edge stop processing is performed in the first and the second cleaning steps is shown. However, the edge stop processing may be performed in at least either the first or the second cleaning step. In the final cleaning step (step S7 in FIG. 5) that does not perform the edge stop processing, the swinging shaft 64 need not move upward at a time point precisely when the cleaning member 61 reaches a predetermined position, but the cleaning member 61 may be separated from the substrate W before at least the certain period of time in the edge stop processing elapses.

In the above description, an example is shown in which the cleaning member 61 is caused to come into contact with the center of the substrate W and the cleaning is performed by moving the cleaning member 61 in one direction from the center to the edge of the substrate W (that is, the cleaning member 61 is separated from the substrate W every time the cleaning member 61 reaches the edge). However, the cleaning member 61 does not necessarily need to be caused to come into contact with the center of the substrate W at first (in step S1), but the cleaning member 61 may be located at a position a little shifted from the center of the substrate W or may be located at a position close to the edge on the opposite side.

Further, the cleaning member 61 may be reciprocated a plurality of times between an arbitrary position of the substrate W (for example, the center or a position close to the edge on the opposite side) and a position close to the edge in a state in which the cleaning member 61 is still in contact with the substrate W. Also in this case, in the reciprocating movements in the cleaning steps other than the final cleaning step, the cleaning member 61 may be stopped for a certain period of time at a position close to the edge of the substrate W and returned to the opposite side, and in the reciprocating movement in the final cleaning step, the cleaning member 61 may be returned to the opposite side without being stopped for a certain period of time at the edge of the substrate W.

In this way, in the present embodiment, the edge stop processing is performed in the cleaning steps other than the final cleaning step, so that a portion close to the edge of the substrate W can be sufficiently cleaned. Further, the edge stop processing is not performed in the final cleaning step, so that it is possible to reduce influence of the reverse contamination due to the edge stop processing.

The cleaning method described above can be applied to apparatuses other than the substrate cleaning apparatus 4 shown in FIG. 2. Hereinafter, some modified examples of the substrate cleaning apparatus 4 of FIG. 2 will be described (descriptions in common with FIG. 2 will be appropriately omitted).

Figure 8:
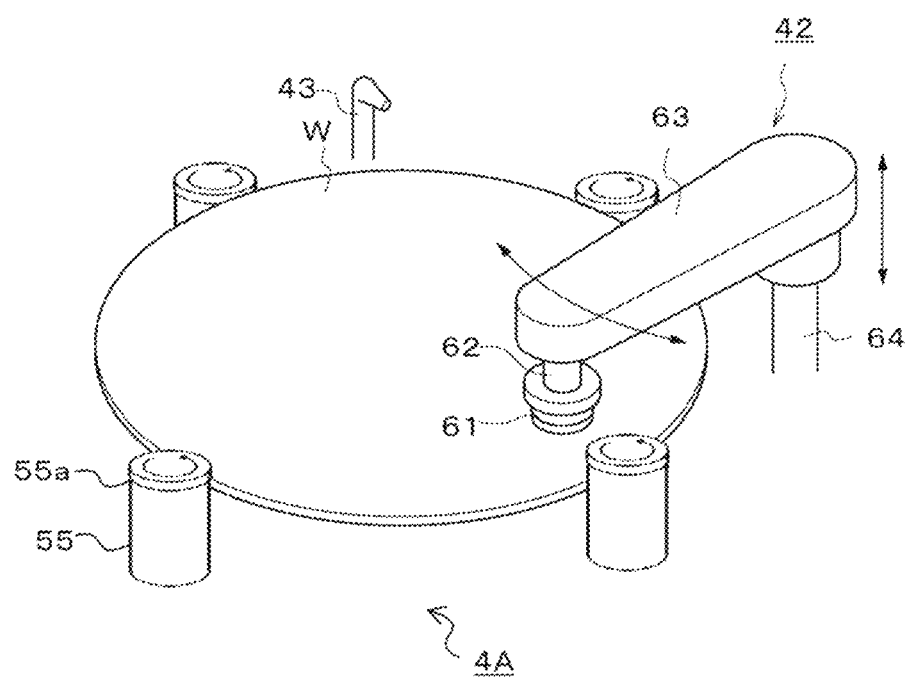
FIG. 8 is a perspective view showing a schematic configuration of another substrate cleaning apparatus 4A.

FIG. 8 is a perspective view showing a schematic configuration of another substrate cleaning apparatus 4A. As a difference from FIG. 2, the substrate cleaning apparatus 4A in FIG. 8 has spindles 55 that support a circumferential edge portion of the substrate W and rotate the substrate W in a horizontal plane as a substrate holding and rotating mechanism. More specifically, the circumferential edge portion of the substrate W is located in holding grooves, each of which is formed on an outer circumferential side surface of a piece 55a provided on an upper portion of the spindle 55, the pieces 55a press the substrate W inwardly, and the substrate W is rotated by rotating (autorotating) at least one piece 55a.

Here the "piece" can be paraphrased as a "holding portion" for holding the substrate. The "spindle" can be paraphrased as a "roller".

In the substrate cleaning apparatus 4 and the substrate cleaning apparatus 4A, an example is shown in which the cleaning member 61 is moved arcuately around the swinging shaft 64. However, the cleaning member 61 may be moved linearly.

Figure 9A:
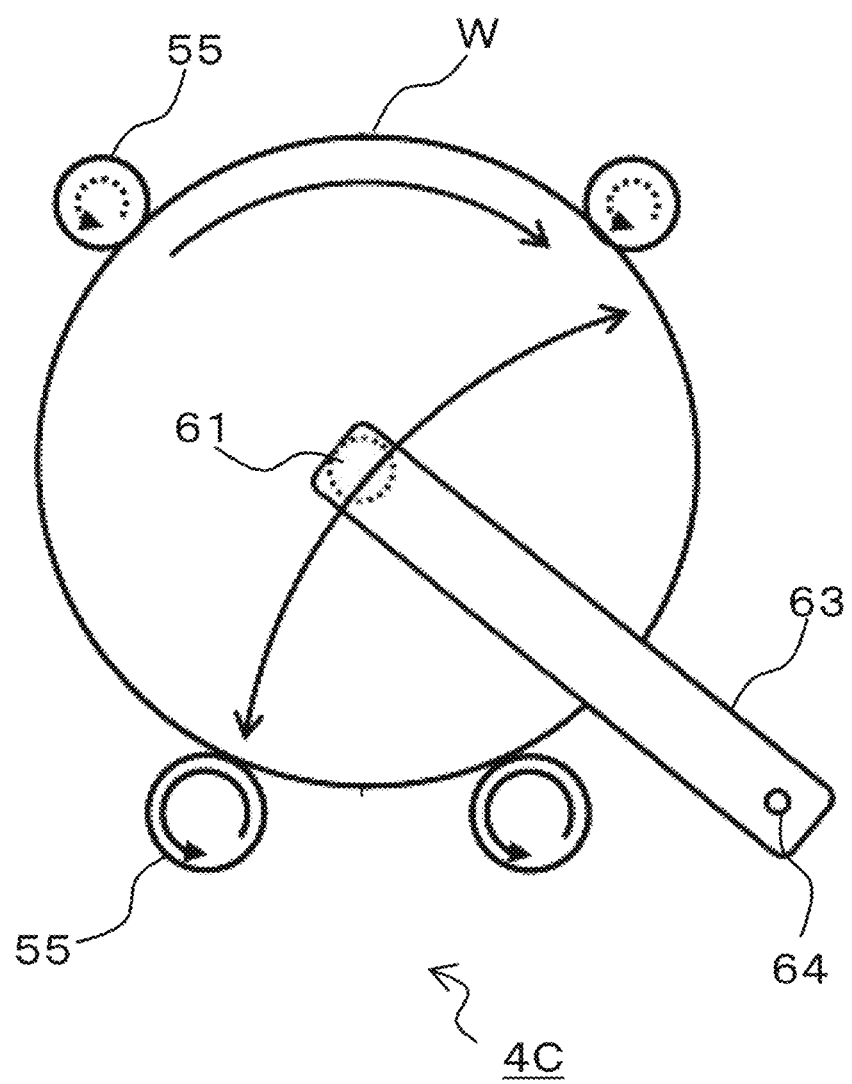
FIG. 9A is a front view showing a schematic configuration of yet another substrate cleaning apparatus 4C.
Figure 9B:
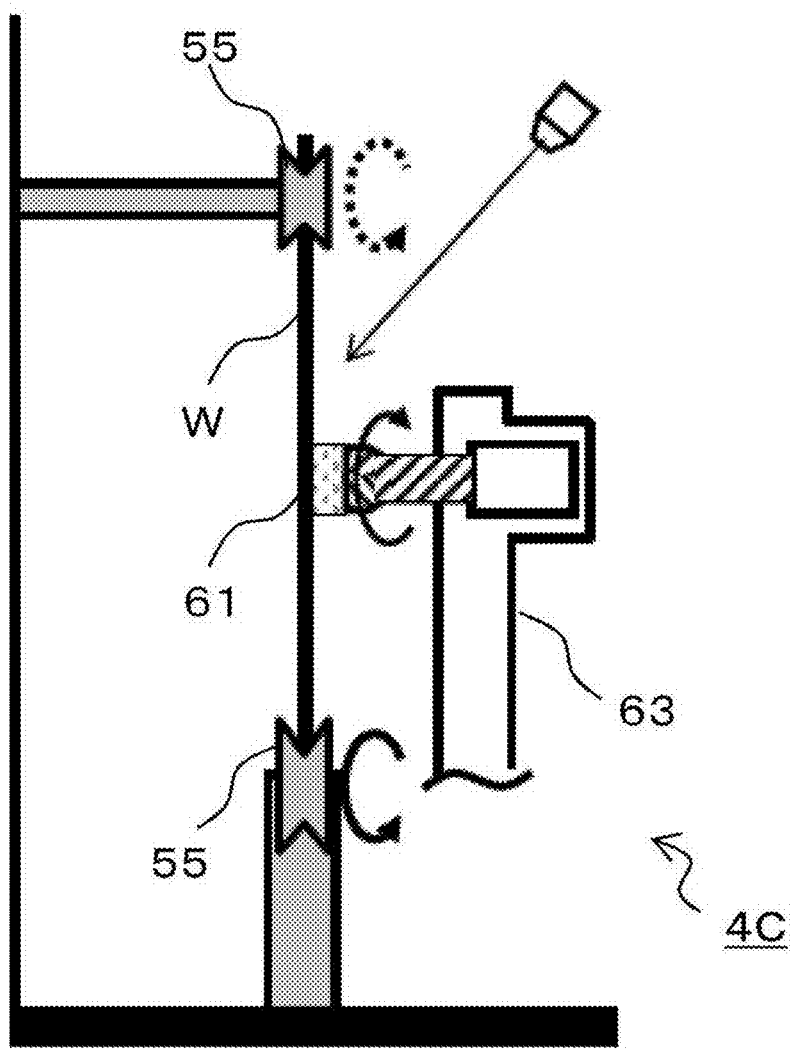
FIG. 9B is a side view showing a schematic configuration of the yet another substrate cleaning apparatus 4C.

FIGS. 9A and 9B are a front view and a side view showing a schematic configuration of yet another substrate cleaning apparatus 4C. The substrate cleaning apparatus 4C holds and rotates the substrate W in a vertical direction.

The substrate cleaning apparatus 4C includes two spindles 55 that hold and rotate a lower portion of the substrate W and two spindles 55 that hold and rotate an upper portion of the substrate W. These spindles 55 are arranged in the same vertical plane, so that the substrate W is hold in the vertical direction. When at least one spindle 55 (preferably, a lower spindle) rotates, the substrate W rotates in the vertical plane. The substrate W may be held by the same chucks as those in FIG. 2 instead of the spindles 55. The swinging shaft 64 that swings the cleaning member 61 and switches contact/non-contact of the cleaning member 61 with the substrate W is desired to be provided in a position as low as possible in order to inhibit particles from falling onto the substrate W.

As a further modified example of the substrate cleaning apparatus 4C, the substrate W may be held and rotated in an oblique direction by not arranging the upper spindles 55 and the lower spindles 55 in the same vertical plane.

Figure 10A:
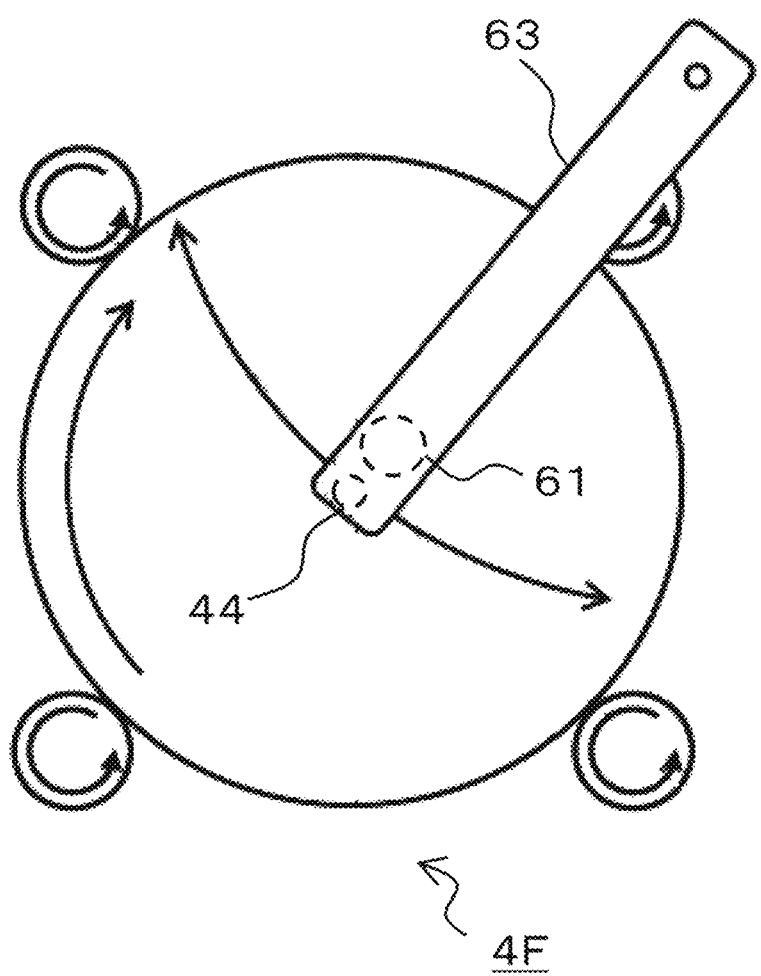
FIG. 10A is a top view showing a schematic configuration of yet another substrate cleaning apparatus 4F.
Figure 10B:
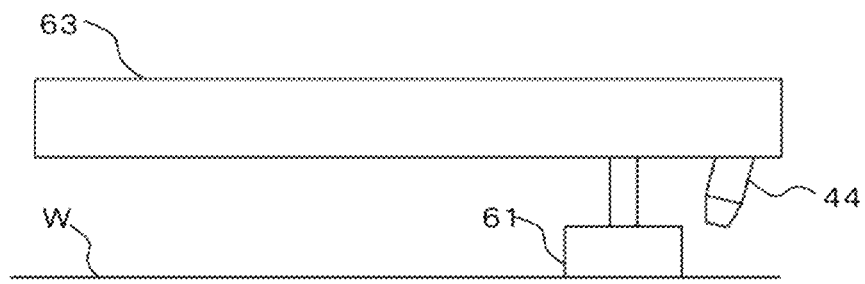
FIG. 10B is a side view showing a schematic configuration of the yet another substrate cleaning apparatus 4F.

FIGS. 10A and 10B are a top view and a side view showing a schematic configuration of yet another substrate cleaning apparatus 4F. In the substrate cleaning apparatus 4F, a nozzle 44 for spraying a chemical liquid as the cleaning liquid is provided to the swinging arm 63. The nozzle that is fixed to the swinging arm 63 and is swung by rotation of the swinging arm 63 is called an on arm nozzle. The nozzle 44 is provided close to the cleaning member 61. Specifically, the nozzle 44 is provided on the swinging arm 63 in a position closer to the tip of the swinging arm 63 than the cleaning member 61 (upstream side of rotation of the substrate W).

As shown in FIG. 10B, a spraying direction of the nozzle 44 is slightly inclined toward the cleaning member 61. Therefore, the cleaning liquid sprayed from the nozzle 44 spreads toward the cleaning member 61. The cleaning member 61 and the nozzle 44 are both attached to the swinging arm 63, so that the cleaning liquid follows the cleaning member 61.

Figure 11:
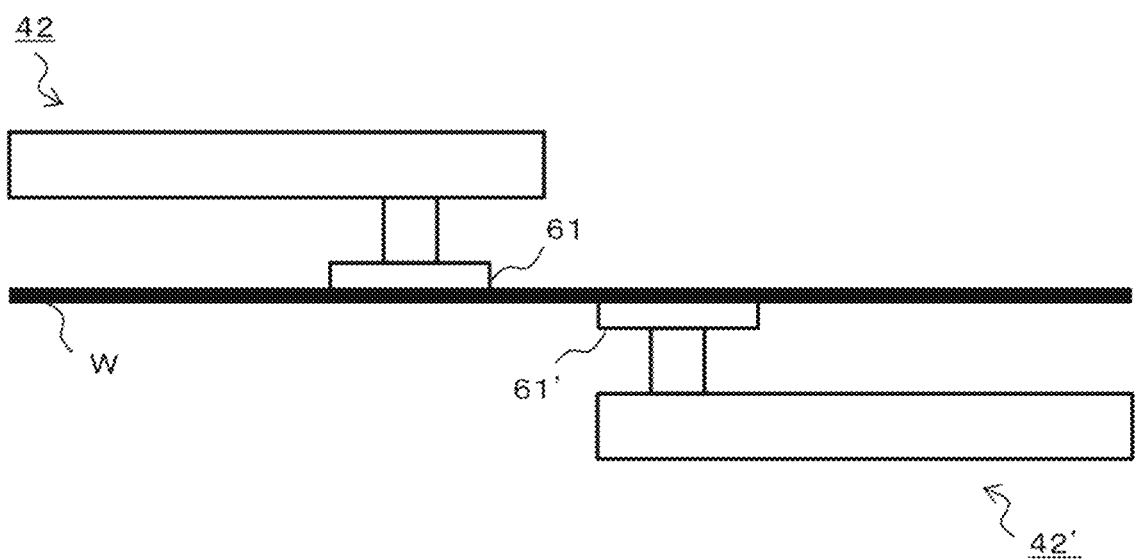
FIG. 11 is a side view showing a schematic configuration of yet another substrate cleaning apparatus 4G.

FIG. 11 is a side view showing a schematic configuration of yet another substrate cleaning apparatus 4G. As shown in FIG. 11, a cleaning mechanism 42' that cleans the lower surface of the substrate W may be provided. The cleaning mechanism 42' can have the same configuration as that of the cleaning mechanism 42, and a cleaning member 61' of the cleaning mechanism 42' comes into contact with and cleans the lower surface of the substrate W. It is possible to perform control so that a portion to which a force is applied by the cleaning member 61 that cleans the upper surface of the substrate W and a portion to which a force is applied by the cleaning member 61 that cleans the lower surface of the substrate W are point symmetric in plan view. By doing so, a force applied from the upper surface side of the substrate W and a force applied from the lower surface side of the substrate W can be point symmetric, so that it can be expected that the forces can be cancelled with each other in a balanced manner. Alternatively, it is possible to perform control so that the portions described above are the same portion in plan view.

In addition, the present disclosure can be applied to buff cleaning that performs contact cleaning which uses a member with a stronger physical force such as a hard pad and a soft pad as the cleaning member 61. In the buff cleaning, the lower surface of the substrate W is held by vacuum suction and rotated.

When the substrate is held and rotated by a method other than a method that holds the substrate by the chucks, the overhang of the cleaning member 61 is possible. When the cleaning member 61 is located on an outer circumferential end of the swinging, a part of the cleaning surface of the cleaning member 61 protrudes to the outside of the outer circumference of the substrate W. That is, even when the cleaning is performed in an overhang state, the edge stop processing, which stops the cleaning member 61 and performs cleaning, is effective in a position of a swinging end of the cleaning member 61. As described in the present embodiment, by performing the edge stop processing in the cleaning steps other than the final cleaning step, it is possible to reduce a moving distance of the cleaning member 61 without decreasing cleaning capability and shorten cleaning time. Therefore, the substrate cleaning described in the present embodiment is useful for various substrate cleaning apparatuses. A signal which the control apparatus receives to stop the swinging in a state in which the cleaning member is overhung may be a signal from a pressure sensor (not shown in the drawings) of the cleaning member included in the cleaning mechanism 42.

Further, configurations of each substrate cleaning apparatus may be appropriately combined.

The above embodiment is described so that a person with an ordinary skill in the technical field to which the invention pertains can implement the invention. Various modified examples of the above embodiment can be naturally made by those skilled in the art, and the technical idea of the invention can be applied to other embodiments. Therefore, the invention is not limited to the described embodiment and should encompass the widest range in accordance with the technical ideas defined by the claims.

REFERENCE SIGNS LIST 4, 4A, 4B substrate cleaning apparatus
41, 41' substrate holding and rotating mechanism
42, 42' cleaning mechanism
43, 44 nozzle
45 driver
46 control apparatus
51 chuck
52 arm
53 base table
54 rotating shaft
55 spindle
55a piece
61, 61' cleaning member
62 rotating shaft
63 swinging arm
63' arm
64 swinging shaft
65 moving mechanism

What is claimed is:

1. A substrate cleaning method that uses a controller to control a driver to move a cleaning member, the method comprising:
contacting the cleaning member with a rotating substrate;
moving the cleaning member between a first position on the substrate and a second position close to an edge of the substrate, n times (n is an integer of 2 or more);
performing edge cleaning of the substrate by maintaining the cleaning member in contact with the second position on the substrate for a predetermined period of time after the cleaning member reaches the second position during at least in one operation of the first to the (n-1)th operations, and
separating the cleaning member from the substrate at a time point when the cleaning member reaches the second position of the substrate in the nth operation without maintaining the cleaning member in contact with the second position on the substrate for the predetermined period of time after the cleaning member reaches the second position.

2. The substrate cleaning method according to claim 1, wherein the edge cleaning is performed after receiving a signal indicating that the cleaning member reached the second position during at least in one operation of the first to the (n-1)th operations.

3. The substrate cleaning method according to claim 1, wherein
the first position is a center on the substrate or a position close to the center, and wherein
(a) the cleaning member comes into contact with the first position on the substrate,
(b) the cleaning member moves to the second position on the substrate while the cleaning member is in contact with the substrate, and
(c) the cleaning member that reaches the second position on the substrate is separated from the substrate, n times, and
the edge cleaning step is performed after the cleaning member reaches the second position during the at least in one operation of the first to the (n-1)th operations.

4. The substrate cleaning method according to claim 1, wherein
a part of an outer circumference of the substrate is held by a holding member and the substrate is rotated, and
the second position is a position where the cleaning member does not interfere with the holding member.

5. The substrate cleaning method according to claim 1, wherein the cleaning member is in contact with the substrate while a rotating direction of the cleaning member is identical to a rotating direction of the substrate.

6. A substrate cleaning apparatus comprising:
a substrate holding and rotating member that holds and rotates a substrate;
a cleaning member;
a driver that moves the cleaning member; and
a controller that controls the driver, the controller configured to at least cause:
the driver to move the cleaning member between a first position on the substrate and a second position close to an edge of the substrate, n times (n is an integer of 2 or more) while the cleaning member is in contact with the rotating substrate,
edge cleaning of the substrate by maintaining the cleaning member in contact with the second position on the substrate for a predetermined period of time after the cleaning member reaches the second position during at least in one operation of the first to the (n-1)th operations, and
the driver to separate the cleaning member from the substrate at a time point when the cleaning member reaches the second position of the substrate in the nth operation without maintaining the cleaning member in contact with the second position on the substrate for the predetermined period of time after the cleaning member reaches the second position.

7. A computer-readable storage medium that non-transitory stores a program that controls a substrate cleaning apparatus including
a substrate holding and rotating member that holds and rotates a substrate,
a cleaning member, and
a driver that moves the cleaning member, wherein
when the program is executed by a controller causes the driver to perform the operations comprising:
moving the cleaning member between a first position on the substrate and a second position close to an edge of the substrate, n times (n is an integer of 2 or more) while the cleaning member is in contact with the rotating substrate,
edge cleaning of the substrate by maintaining the cleaning member in contact with the second position on the substrate for a predetermined period of time after the cleaning member reaches the second position during at least in one operation of the first to the (n-1)th operations, and
separating the cleaning member from the substrate before the predetermined period of time elapses after the cleaning member reaches the second position of the substrate in the nth operation.

* * * * *